United States Patent
Marchand et al.

(10) Patent No.: US 10,408,888 B2
(45) Date of Patent: Sep. 10, 2019

(54) DEVICE AND METHOD FOR EARLY DETECTION OF POWER FAILURE IN AN EXTERNAL POWER SUPPLY

(71) Applicant: InterDigital CE Patent Holdings, SAS, Paris (FR)

(72) Inventors: Philippe Marchand, Vitre (FR); Gerard Morizot, Voiron (FR)

(73) Assignee: INTERDIGITAL CE PATENT HOLDINGS, Paris (FR)

(*) Notice: Subject to any disclaimer, the term of this patent is extended or adjusted under 35 U.S.C. 154(b) by 370 days.

(21) Appl. No.: 14/438,976

(22) PCT Filed: Oct. 30, 2013

(86) PCT No.: PCT/EP2013/072727
§ 371 (c)(1),
(2) Date: Apr. 28, 2015

(87) PCT Pub. No.: WO2014/068006
PCT Pub. Date: May 8, 2014

(65) Prior Publication Data
US 2015/0301126 A1    Oct. 22, 2015

(30) Foreign Application Priority Data
Oct. 31, 2012  (EP) .................................. 12306356

(51) Int. Cl.
*G01R 31/42* (2006.01)
*G06F 1/30* (2006.01)
(Continued)

(52) U.S. Cl.
CPC ......... *G01R 31/42* (2013.01); *G01R 19/2506* (2013.01); *G06F 1/30* (2013.01);
(Continued)

(58) Field of Classification Search
CPC ................ G01R 31/42; G01R 19/2506; G01R 31/31721; G01R 31/31924;
(Continued)

(56) References Cited

U.S. PATENT DOCUMENTS

| 4,234,920 A | 11/1980 | Van Ness et al. |
| 4,973,901 A * | 11/1990 | Balch ................. G01R 21/1333 324/103 R |

(Continued)

FOREIGN PATENT DOCUMENTS

| CN | 101447691 A | 6/2009 |
| CN | 101572484 A | 11/2009 |

(Continued)

OTHER PUBLICATIONS

Nishimura Hiromichi, Inverter Device, Oct. 1, 1995, Toshiba Corp, JP07-007993.*
Search Report dated Jan. 16, 2014.

*Primary Examiner* — Melissa J Koval
*Assistant Examiner* — Nasima Monsur
(74) *Attorney, Agent, or Firm* — Volpe and Koenig, P.C.

(57) ABSTRACT

An external power supply converts AC power to DC Power for a device. The external power supply and the device comprise circuits that provide early AC input failure detection so that the device can take measures such as to safe keep data as long as the external power supply continues to provide DC power to the device.

21 Claims, 5 Drawing Sheets

(51) Int. Cl.
  *H04B 3/54*   (2006.01)
  *G01R 19/25*  (2006.01)
  *H02J 9/00*   (2006.01)
  *H02J 13/00*  (2006.01)

(52) U.S. Cl.
  CPC ............ *H04B 3/546* (2013.01); *H04B 3/548* (2013.01); *H02J 9/00* (2013.01); *H02J 13/0003* (2013.01); *H02J 13/0096* (2013.01); *H04B 2203/5416* (2013.01)

(58) Field of Classification Search
  CPC .. G01R 19/16538; H04B 3/548; H04B 3/546; H04B 2203/5416; G06F 1/30; H02J 9/00; H02J 13/0096; H02J 13/0003
  USPC ......... 324/764.01; 307/125, 126, 130, 2, 43; 315/161, 201, 86; 327/544; 363/15; 714/E11.083, 14
  See application file for complete search history.

(56) References Cited

U.S. PATENT DOCUMENTS

| | | | |
|---|---|---|---|
| 6,445,086 B1* | 9/2002 | Houston | G06F 1/30 307/150 |
| 6,448,086 B1 | 9/2002 | Khosravi et al. | |
| 8,266,458 B2* | 9/2012 | Inoue | G06F 9/455 702/60 |
| 2002/0080010 A1 | 6/2002 | Zhang | |
| 2002/0138772 A1 | 9/2002 | Crawford et al. | |
| 2004/0061616 A1 | 4/2004 | Fischer et al. | |
| 2006/0055549 A1* | 3/2006 | Fischer | G06F 1/30 340/635 |
| 2006/0077046 A1 | 4/2006 | Endo | |
| 2006/0119368 A1* | 6/2006 | Sela | G01R 19/2513 324/522 |
| 2006/0214510 A1 | 9/2006 | Patel | |
| 2006/0242458 A1* | 10/2006 | Feldman | G06F 11/1441 714/14 |
| 2010/0169031 A1* | 7/2010 | Dishman | G01R 31/40 702/60 |
| 2010/0176814 A1* | 7/2010 | Couture | G01R 31/085 324/521 |
| 2011/0099394 A1* | 4/2011 | Brown | G06F 1/30 713/310 |
| 2011/0150126 A1 | 6/2011 | Lamon et al. | |

FOREIGN PATENT DOCUMENTS

| | | |
|---|---|---|
| JP | 2003092844 | 3/2003 |
| JP | 2009-284290 A | 12/2009 |
| JP | 2009-303456 A | 12/2009 |
| KR | 920368 B1 | 10/2009 |

* cited by examiner

DEVICE AND METHOD FOR EARLY DETECTION OF POWER FAILURE IN AN EXTERNAL POWER SUPPLY

This application claims the benefit, under 35 U.S.C. § 365 of International Application PCT/EP2013/072727, filed Oct. 30, 2013, which was published in accordance with PCT Article 21(2) on May 8, 2014 in English and which claims the benefit of European patent application No. 12306356.2, filed Oct. 31, 2012.

1. FIELD OF INVENTION

The present invention generally relates to power failure detection.

2. TECHNICAL BACKGROUND

With the introduction on the market of more and more microprocessor controlled devices such as personal computers, CE (Consumer Electronic) devices and industrial applications, power failure detection has become an important issue, since these devices are prone to important malfunctioning when submitted to unexpected power outage. One of the possible causes of power failure is a power outage of the mains input of the power supply. Such power outage occurs for example when a person trips over a power cord, is due to a general power outage on the electrical power network or is simply due to a user pressing a power off button. As a mains power failure occurs, capacitors on the DC side of the power supply will be able to continue to provide power during a short delay. There is thus a delay between an AC power failure and its detection on the DC side of a power supply. When DC power fails after the discussed delay due to an interruption of AC input, the prior art power failure detection system thus loses precious time that could be used for an orderly shutdown of the device integrating the power failure detection system. To this regard, prior art of "early" power failure detection comprises U.S. Pat. No. 6,469,883B1 to Zens, date of patent Oct. 22, 2002, that describes a method and apparatus for early AC power failure detection that operates using a counter which starts counting upon a zero crossing of the AC input and that is reset upon each subsequent zero crossing. If the counter exceeds a certain threshold value, this is an indication of a power failure. But prior art has in common that the power failure circuits are for devices that have an on-board or internal power supply. The on-board power supply requirement conflicts with a current trend to externalize the DC power supply of devices. Using an external DC power supply is advantageous in terms of cost and space reduction as well as in terms of ease of maintenance and of adaptability to different types of mains power for international use. Therefore, electronic devices often use an external power supply, called AC adapter, AC/DC adapter, or AC/DC converter. Such a power supply/adapter/converter has a single regulated DC output that comprises two conducting leads, one for the positive pole and the other one for the negative pole. Then, it is not obvious to contemplate a technical solution for providing an early power failure detection arrangement for a device that receives regulated DC power from an external power supply because the device has no longer access to unregulated AC or DC.

There is thus a need for further optimization of prior art solutions.

3. SUMMARY OF THE INVENTION

The present invention aims at alleviating some inconveniences of prior art.

To this end, the invention comprises a method of electric power failure detection for an electronic device receiving Direct Current power from an external power supply. The external power supply has an Alternating Current (AC) input for connection to a mains electricity network and that the external power supply has a Direct Current output for connection to the electronic device via Direct Current power conducting leads. The method is implemented by the external power supply. The method comprises a step of detecting absence of supply of mains power on the Alternating Current input of the external power supply, and further comprises a step of transmitting information representative of the absence of supply of mains power on the Alternating Current input when the absence of supply of mains power on the Alternating Current input of the external power supply is detected.

According to a variant embodiment of the method of electric power failure detection for an electronic device, implemented by the external power supply, the method further comprises a step of estimating a duration of a capacity of the external power supply to continue to provide Direct Current power to the electronic device when the absence of supply of mains power on the Alternating Current input of the external power supply is detected, the information comprising a result of the estimating.

According to a variant embodiment of the method of electric power failure detection for an electronic device, implemented by the external power supply, the method further comprises a step of measuring a duration of the absence of supply of mains power on the Alternating Current input of the external power supply when the absence of supply of mains power on the Alternating Current input of the external power supply is detected, the information comprising a result of the measuring.

According to a variant embodiment of the method of electric power failure detection for an electronic device, implemented by the external power supply, the information is transmitted over the Direct Current power conducting leads.

According to a variant embodiment of the method of electric power failure detection for an electronic device, implemented by the external power supply, the information is transmitted by means of modulating a carrier signal on at least one of the Direct Current power conducting leads.

According to a variant embodiment of the method of electric power failure detection for an electronic device, implemented by the external power supply, the information is transmitted by means of modulating Direct Current output voltage level on at least one of the Direct Current power conducting leads.

The present invention also relates to a method of electric power failure detection for an electronic device receiving Direct Current power from an external power supply. The external power supply has an Alternating Current input for connection to a mains electricity network, and a Direct Current output for connection to the electronic device via Direct Current power conducting leads. The method is implemented by the electronic device and comprises a step of receiving information representative of an absence of supply of mains power on the Alternating Current input of the external power supply, the absence being detected by the external power supply, and further comprises a step of transmitting the information to the electronic device so as to inform it of an imminent Direct Current power failure.

According to a variant embodiment of the method of electric power failure detection for an electronic device, implemented by the electronic device, the information comprises an estimation of a duration of the capacity of the external power supply to continue to provide Direct Current power to the electronic device when the absence of supply of mains power on the Alternating Current input of the external power supply is detected by the external power supply.

According to a variant embodiment of the method of electric power failure detection for an electronic device, implemented by the electronic device, the information further comprises a measurement of a duration of the absence of supply of mains power on the Alternating Current input of the external power supply when the absence of supply of mains power on the Alternating Current input of the external power supply is detected by the external power supply.

According to a variant embodiment of the method of electric power failure detection for an electronic device, implemented by the electronic device, the information is received via the Direct Current power conducting leads.

According to a variant embodiment of the method of electric power failure detection for an electronic device, implemented by the electronic device, the information is received by means of modulation of a carrier signal on at least one of the Direct Current power conducting leads.

According to a variant embodiment of the method of electric power failure detection for an electronic device, implemented by the electronic device, the information is transmitted by means of modulating Direct Current output voltage level on at least one of the Direct Current power conducting leads.

The present invention also relates to an external power supply for providing Direct Current power to an electronic device. The external power supply has an Alternating Current input for connection to a mains electricity network and the external power supply has a Direct Current output for connection to the electronic device via Direct Current power conducting leads. The external power supply comprises a detector for detecting absence of supply of mains power on the Alternating Current input of the external power supply, and further comprises a transmitter for transmitting information representative of the absence of supply of mains power on the Alternating Current input when the absence of supply of mains power on the Alternating Current input of the external power supply is detected by the detector.

According to a variant embodiment of the external power supply the detector is directly coupled to the Alternating Current input of the external power supply and/or to internal unregulated alternating current output of the external power supply and/or to internal unregulated Direct Current output of the external power supply.

The present invention also relates to an electronic device for connection to an external power supply. The external power supply has an Alternating Current input for connection to a mains electricity network and the external power supply has a Direct Current output for connection to the electronic device via Direct Current power conducting leads. The electronic device comprises a receiver for receiving information representative of an absence of supply of mains power on the Alternating Current input of the external power supply, and further comprises a transmitter for transmitting the information so as to inform the electronic device of an imminent Direct Current power failure.

4. LIST OF FIGURES

More advantages of the invention will appear through the description of particular, non-restricting embodiments of the invention. The embodiments will be described with reference to the following figures.

5. DETAILED DESCRIPTION OF THE INVENTION

Figure 1:
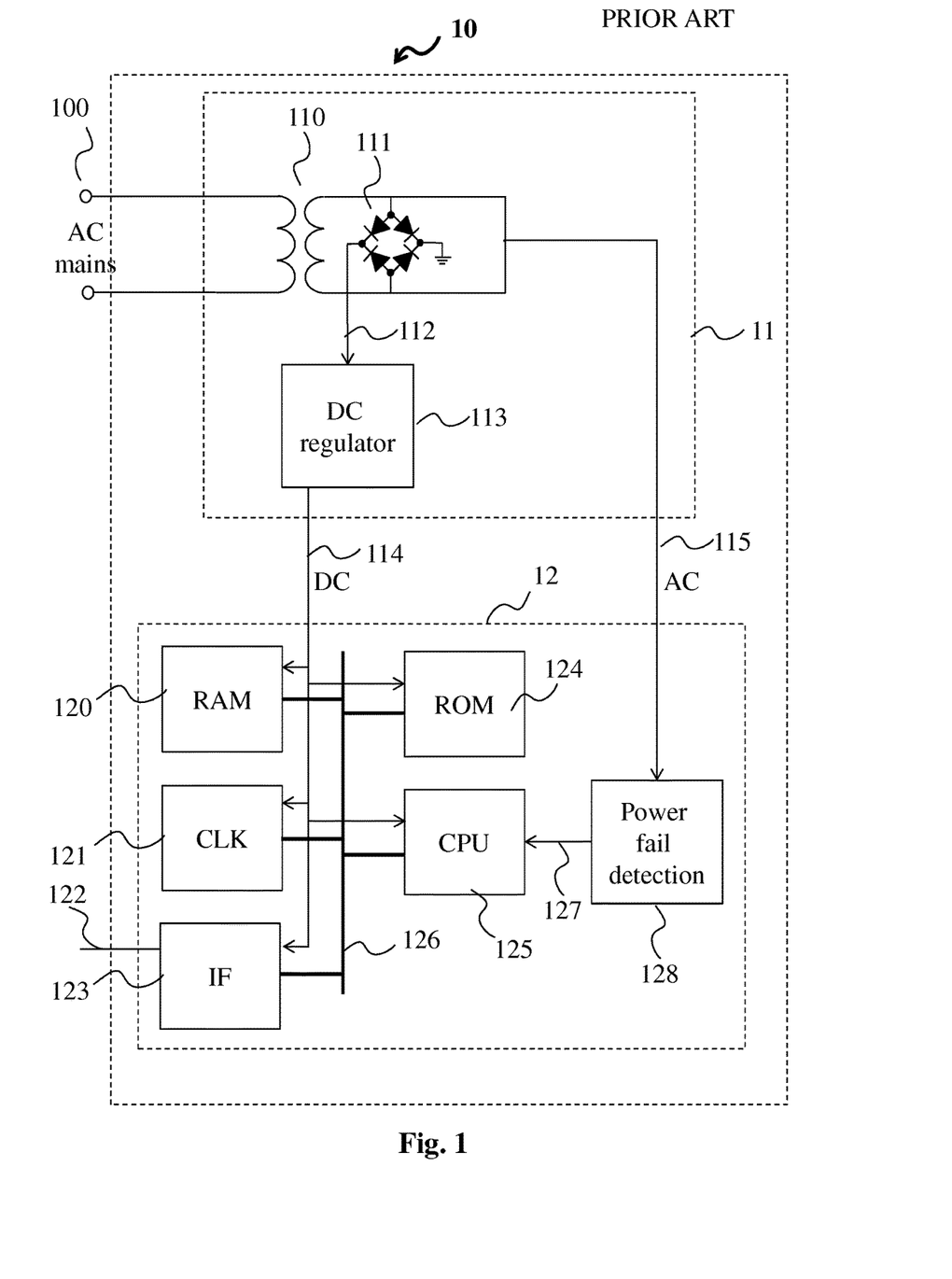
FIG. 1 is a block-diagram of a prior art device 10 implementing early power failure detection. The device comprises an internal power supply.

FIG. 1 is a block-diagram of a device 10 implementing prior-art early power failure detection.

Electronic device 10 comprises an internal power supply 11 and additional device hardware 12. The internal power supply is fed with mains power from a power line 100 that can be connected to a mains electricity network (not shown), the mains electricity network in turn receiving its power from a power utility, also called electric utility or electric power company, that provides electrical energy to many factories and homes. The internal power supply comprises a transformer 110 that converts the AC (Alternating Current) mains voltage to a lower AC output voltage. This lower AC voltage is input to a bridge rectifier circuit 111 that produces an unregulated DC (Direct Current) voltage on output 112, with is regulated by a DC regulator circuit 113 that converts the low-voltage AC to low-voltage DC. The output of the DC regulator circuit 113 directly provides the additional hardware 12 with low-voltage regulated DC via power leads 114. The internal power supply further comprises a low voltage AC output for early power failure detection as will be discussed hereafter.

The additional device hardware 12 comprises a CPU (Central Processing Unit) 125 or MPU (Micro Processor Unit), ROM (Read-Only Memory) 124 for persistent storage of a software program comprising computer-readable instructions for the CPU and for storage of other parameters and variables used by the software program that require to be stored in a persistent manner. It further comprises a RAM (Random Access Memory) 120 for temporary storage of data that are used during the execution of the software program, a network interface 123 for communication of the device with an external network such as for example a LAN (Local Area Network) or a WAN (Wide Area Network) via connection 122, a clock unit 121 that provides the components 120 and 123-125 with timing and synchronization means, and an internal data communication bus 126 that provides the latter components with an internal means for communication. The additional hardware 12 further comprises a power fail detection circuit 128 that will be discussed hereafter.

When a power failure occurs in the AC circuit of the internal power supply 11, the power fail detection circuit 128, that monitors the transformed AC via connection 115, informs the CPU of the power failure via connection 127, for example by raising an NMI (Non-Maskable Interrupt). Raising the NMI forces the CPU to enter a specific interrupt software program, that takes appropriate actions to save data in the RAM to the ROM so that the device 10 is prepared for an imminent power drop. Possibly, the specific interrupt software program saves data on an external disc drive and informs a user of the device of the imminent shut down due to the power failure.

Figure 2:
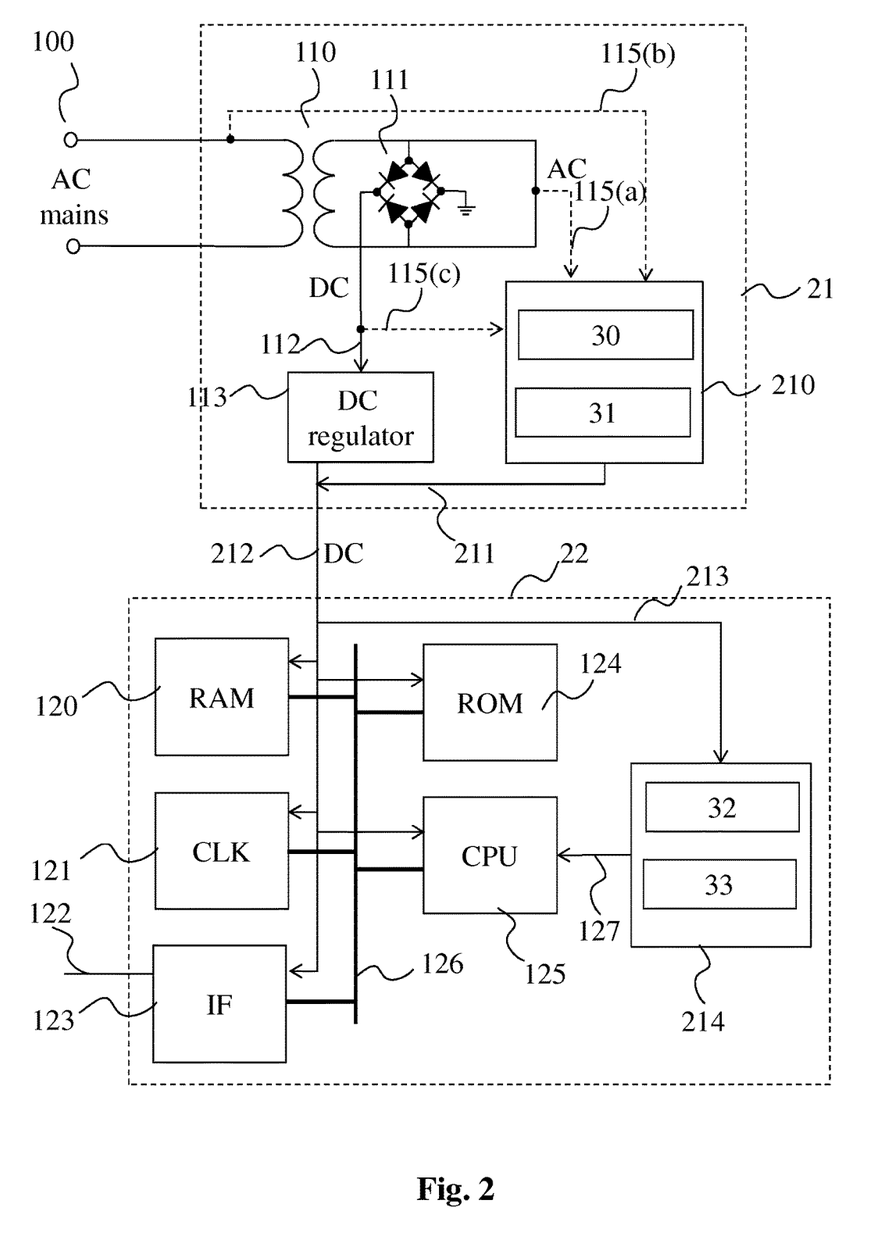
FIG. 2 is a block diagram of a device 22 with external power supply 21 according to a particular, non-limiting embodiment of the invention.

FIG. 2 is a block diagram of a device 22 with external power supply 21 according to a particular, non-limiting embodiment of the invention. In contrast with the prior-art device 10 of FIG. 1, the electronic device 22 is equipped with an external power supply 21, that is for example an AC adapter. The external power supply and the electronic device 22 are connected via a low-voltage DC power cord 212, that merely comprises DC power conductor or DC power conducting leads; typically, only two power conductor leads are used, one for a positive pole and one for a negative pole, but more DC power leads are sometimes used according to the needs of the electronic device used, such as a first pole for ground (GND), a second pole for +5V, and a third pole for +12V. As internal power supply 11 of device 10 of FIG. 1, the external power supply 21 comprises elements and connections 110-113 and 115 that have already been discussed. External power supply 21 comprises an additional power fail circuit 210 that will be discussed further on. Device 22 comprises among others elements and connections 120-127 that have already been discussed. Device 22 comprises additionally a power fail circuit 214 that will be discussed hereafter.

As can be observed and in contrast with the prior art device 10 of FIG. 1, the connection between the external power supply 21 and device 22 is reduced to a single connection 212. This single connection, over which transits both regulated DC power and power fail related information, is made possible by an additional power fail circuit 210 in external power supply 21 that cooperates with a power fail circuit 214 in device 22. Power fail circuit 210 is either connected (115(*a*)) to internal AC output, e.g. to the secondary winding of transformer 110 (the secondary winding corresponds to an alternating current output of the external power supply) so that it receives as input unregulated, low power AC. As there is no considerable delay in propagation of a power failure in the primary winding of the transformer to the secondary winding, the power fail circuit 210 thus detects the absence of supply of mains power to the external supply, i.e. on terminals 100, before DC power output from DC regulator 113 starts to drop. Alternatively, power fail circuit 210 is directly connected (115(*b*)) to the AC input, or alternatively, power fail circuit 210 is connected to internal unregulated DC output (115(*c*)). If the power fail circuit 210 detects such absence of mains power on the AC input of the power supply (e.g. by either of the variants 115(*a*),115(*b*) or 115(*c*), it transmits information representative of an absence of mains power supply on the AC input of the external power supply to the device 22. This information can be transmitted via the DC power conductor leads 211, for example through modulation on the power conductor leads. In device 22, this information on the absence of supply of mains power on the AC input of the external power supply is handled by power fail circuit 214. Power fail circuit 214 that receives the information via connection 213, and transmits the information to the electronic device, for example to CPU 125, e.g. by providing an NMI as previously discussed, so as to inform it of an imminent DC power failure. Elements 30-33 are discussed later on with regard to FIG. 3.

According to a variant embodiment of the invention, method comprises estimating a duration of a capacity of the external power supply to continue to provide DC power to the electronic device when the absence of supply of mains power to the AC input of the external power supply is detected, the estimated duration being provided in the previously discussed information. The estimation depends on one or more parameters such as for example: the power consumption of the device; the hardware configuration of the external power supply in terms of energy stored in capacitors, or energy stored in a battery pack that can take over the power supply for a certain period; or the supply voltage tolerance of the device, the duration can be estimated according to the actual current consumption of the device, as a function of a current consumption history of the device, or both. This variant has the advantage that the device is not only informed of the absence of supply of mains power to the AC input of the external power supply, but in addition is informed on how long the external power supply estimates to be capable to continue to supply DC power to the device, giving the device the opportunity to take actions that are appropriate according to the estimated duration. For example, if the estimated duration is too short to save the current state of processing of the device on a hard disk drive, the device can decide to save only the state of variables in RAM memory to a solid state, fast NVRAM memory, to at least ensure correct restarting of the device when the power is reestablished later on, even if data related to the process that is ongoing at the moment of the power failure cannot be restored.

According to a variant embodiment of the invention that can advantageously be combined with the previous embodiments, the transmitting of information representative of an absence of mains power supply on the AC input of the external power supply is transmitted through modulation of a carrier signal on one or more of the DC power conductor leads 212 of the external power supply. This transmission is for example done using a power line communication (PLC) method that functions by impressing a modulated carrier signal on one or more of the DC power conductor leads. Such modulation can be done for example by amplitude modulation or frequency modulation. The modulation pattern is a pattern that is recognized by the power fail circuit 214 in device 22. According to a variant embodiment, the modulation is a digital signal that comprises a message that is transmitted in digital format. According to a variant embodiment, the message comprises a header and a payload. According to a variant embodiment, the header indicates a type of message, and the payload comprises data that is related to the type of message, such as the previously discussed estimated duration. These modulation methods have the advantage that they do not influence the tension (voltage) or the current provided on the conductor leads. The power fail circuit 214 in device 22 demodulates the modulated carrier signal and converts it into a power failure or absence detection signal that is provided to the CPU.

According to a variant embodiment that can advantageously be combined with the previous embodiments, the transmission is a modulation of DC power output voltage level on the one or more DC power conductor leads of the external power supply. This variant results in variation within predetermined limits of the output voltage provided on the conductor leads. The predetermined limits are a function of the hardware configuration of the device and correspond to the voltage variation that can be tolerated by the device without disturbing the correct functioning of the device. For example a variation of + or −250 mV (milli Volts) in a 5V power supply feeding a microprocessor-based device, corresponding to a voltage tolerance of 5% that is acceptable according to the microprocessor data sheet.

According to a variant embodiment of the present invention that can advantageously be combined with the previous embodiments, the modulation of the carrier signal is a function of a duration of the absence of supply of mains power to the AC input of the external power supply. For example, the frequency of modulation is a function of the duration of the power failure or absence. For example, the frequency is proportional to the duration, the frequency being increased in a linear or stepwise manner as the absence of supply of mains power is prolonged.

According to a variant embodiment of the present invention that can advantageously be combined with the previous variant embodiments of transmission by modulation of DC power output voltage level and the variant where modulation of the carrier signal is a function of the duration of the absence of supply of mains power, the modulation of the DC power output voltage is a function of a duration of the absence of supply of mains power to the external power supply. For example, the frequency of modulation is a function of the duration of the mains power absence. For example, the frequency is proportional to the duration, the frequency being increased in a linear or stepwise manner as the absence of supply of mains power is prolonged. This variant and the previous variant have the advantage for a device that receives the information, that it is informed of such prolonging, which is useful for example to take additional, more important measures to prepare the device for an imminent power drop.

According to a variant embodiment of the present invention that can advantageously be combined with the previous embodiments, the absence of supply of mains power to the external power supply is detected on a mains input (100) of the external power supply, as depicted by arrow 115(*b*). This variant embodiment has the advantage that the power failure is detected as early as possible. According to a variant embodiment of the present invention that can advantageously be combined with the previous embodiments, the absence of supply of mains power to the external power supply is detected on an internal unregulated output (such as for example: 115(*c*): unregulated DC, or 115(*a*): unregulated low voltage AC) of the external power supply; note that this "output" is internal to the power supply (e.g. the output is not connected to the DC power conducting leads 212). These variants embodiments can be advantageous in terms of number and cost of components used for the detection. If combined they can be used to inform the device that uses the external power supply of the cause of the absence, and the cause can be included in the information that the power fail circuit 210 of external power supply 21 transmits to the power fail circuit 214 of the device 22. If the absence is for example detected on the internal unregulated AC output (115(*a*)) but not on the mains input (115(*b*)), it is the external power supply, and in particular the transformer 110, that is the cause of the power fail. If the absence is for example detected on the internal unregulated DC output (115(*c*)), but not on mains input (115(*b*)) and not on internal unregulated AC output (115(*a*)), the cause of the failure is probably the bridge rectifier circuit 111.

Figure 3:
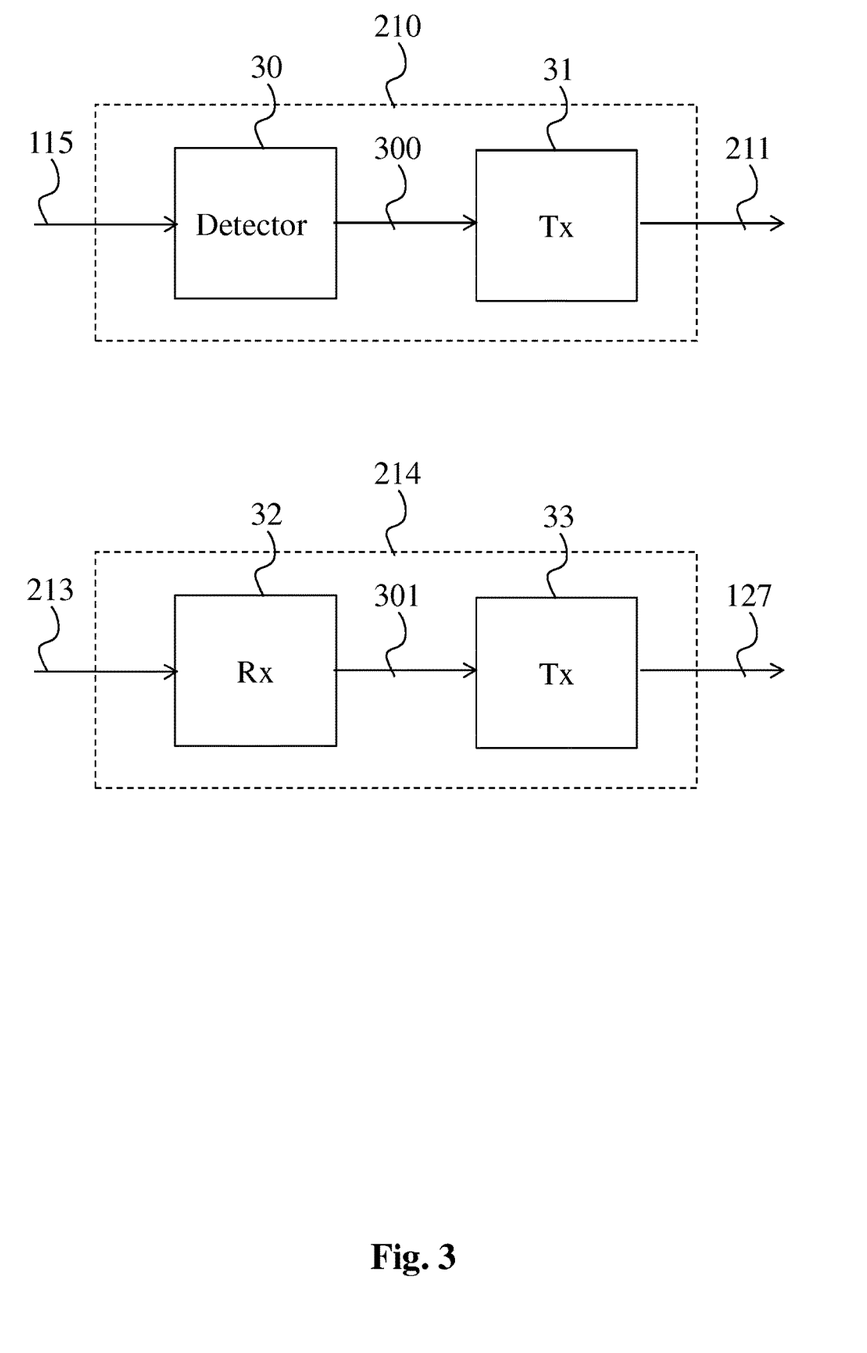
FIG. 3 is a block diagram that further details power fail circuits 210 and 214 of FIG. 2 according to a particular non-limiting embodiment of the invention.

FIG. 3 is a block diagram that further details power fail circuits 210 and 214 of FIG. 2 according to a particular non-limiting embodiment of the invention. Power fail circuit 210 comprises a detector circuit 30 or detector module 30 and a transmitter circuit 31 or transmitter module 31. The detector 30, for detecting an absence of supply of mains power on the AC input of the external power supply, is connected to either one or several of connections 115(*a*), 115(*b*) or 115(*c*) as previously discussed. The transmitter module 31 transmits (e.g. by the previous discussed means of modulating), via connection 211, the information representative of the absence of supply of mains power on the AC input when the absence is detected by the detector 30. On the device (22) side, power fail circuit 214 receives its input from power connector lead 212 via connection 213. The power fail circuit 214 comprises a reception circuit, or reception module, or receiver, or interface 32 that possibly comprises a demodulator circuit or demodulator module (not shown). The reception circuit receives the information representative of an absence of supply of mains power on the AC input of the external power supply, and outputs the information to transmitter module or circuit 33 which transmits the information to output 127 that is for example connected to CPU 125. The output is for example an NMI signal, or the toggling of a bit in a register of RAM memory that indicates a power fail detection, or information, that when provided to the CPU, informs the electronic device of the imminent DC power failure and that possibly informs it of any other information provided in the received information such as the previously discussed estimation of a duration of the capacity of the external power supply to continue to provide DC power to the electronic device, and/or the measured duration of the absence of AC power, and/or the cause of the imminent failure.

Figure 4:
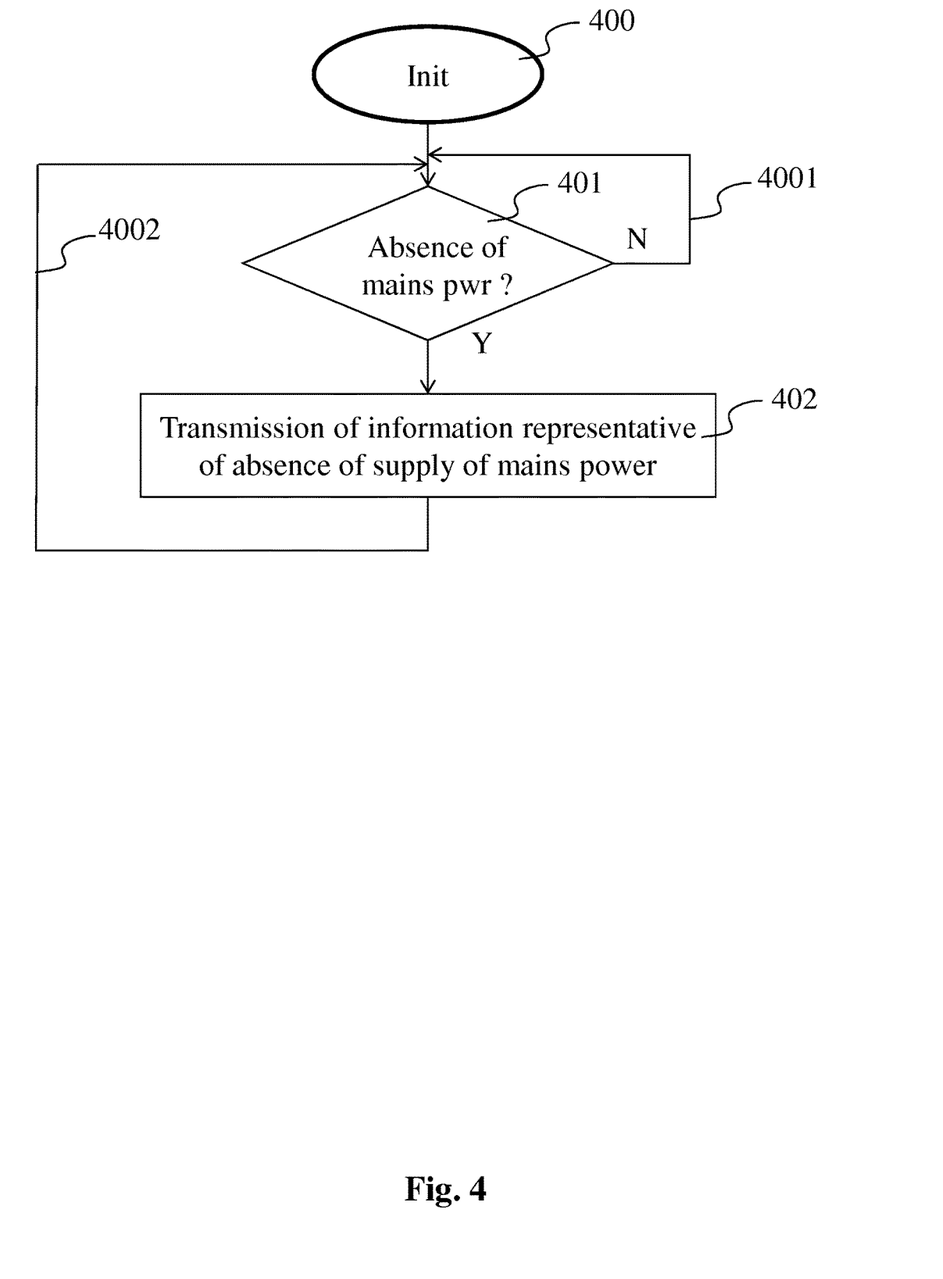
FIG. 4 is a logical diagram of the method of electric power failure detection of the invention according to a non-limiting example embodiment, such as for example implemented by power supply 21 of FIG. 2.

FIG. 4 is a logical diagram of the method of electric power failure detection of the invention according to a non-limiting example embodiment, such as for example implemented by external power supply 21 of FIG. 2.

In a first initialization step 400, the method is initialized, the initialization comprising for example the setting of parameters related to initialization of power failure circuit 210 of external power supply 21, such as zeroing of counters, initialization of timers, or automatic adjusting of comparator circuits.

If no absence of supply of mains power on the AC input of the external power supply is detected, the method iterates step 401 via 4001.

If the absence is however detected, a step of transmission 402 is engaged. Then, the method iterates to step 401 via 4002.

Figure 5:
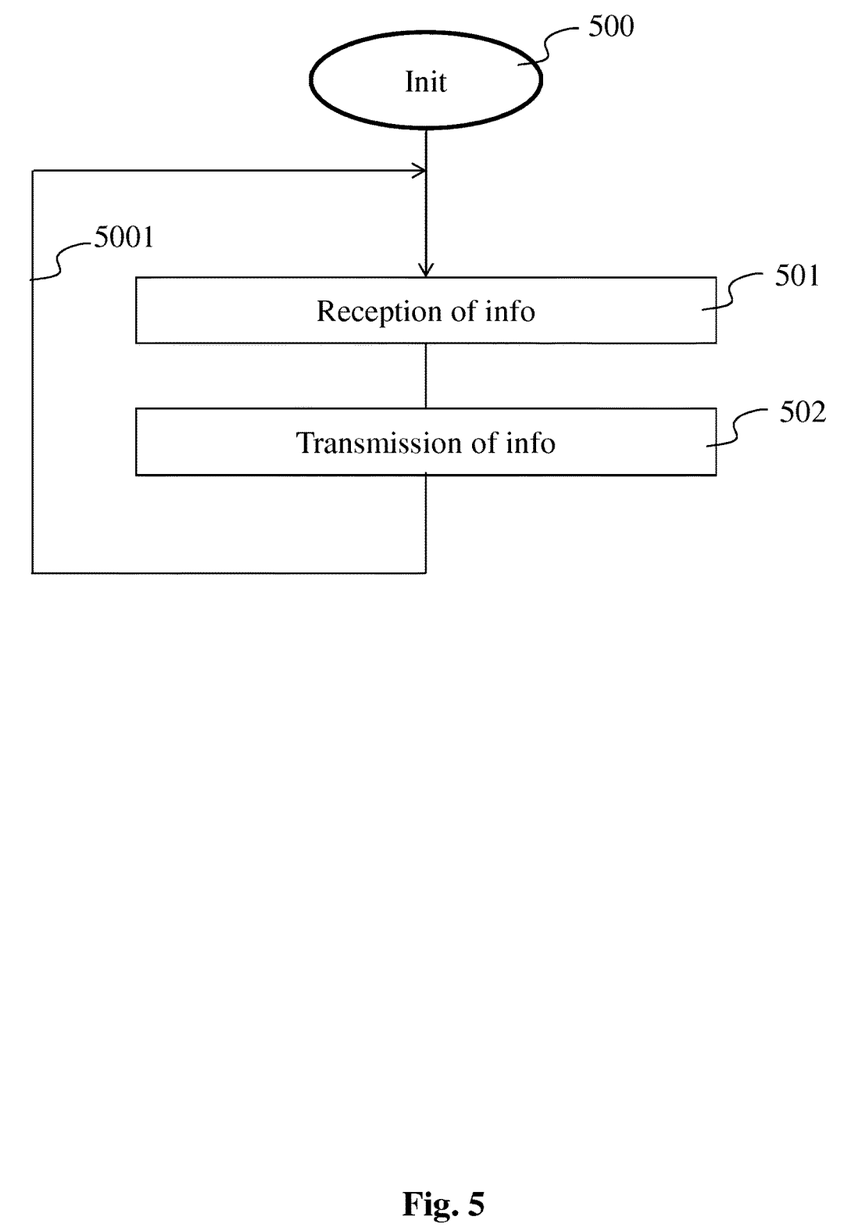
FIG. 5 is a logical diagram of the method of electric power failure detection of the invention according to a non-limiting example embodiment, such as for example implemented by device 22 of FIG. 2.

FIG. 5 is a logical diagram of method of electric power failure detection of the invention according to a non-limiting example embodiment, such as for example implemented by device 22 of FIG. 2.

The method comprises an initialization step, in which variables and parameters used by the method are initialized, such as parameters and variables stored in RAM memory 120. The method further comprises a step 501 of reception of information representative of an absence of supply of mains power on the AC input of the external power supply. This step is for example executed by reception circuit 32 of FIG. 3. In a step 502, the information is transmitted to the electronic device (for example, to CPU 125) so as to inform it of an imminent DC power failure. This step is for example implemented by transmitter 33. The method reiterates via 5001 to return to the reception step 501.

The current invention allows thus a more flexible management of power failure detection than is possible according to cited prior art. Among other advantages, the invention allows to provide early power fail detection on the AC input of an external power supply, without adding additional wiring to the power supply DC output conductor leads. Among advantages of variants of the present invention, peripheral devices are informed of an estimation of the duration of the capacity of the power supply to continue to provide DC power to the connected device in absence of supply of mains power to the AC input of the external power supply, which allows such a connected device to take appropriate actions that depend on the estimated duration. The invention is not limited to applications where power failure is 'accidental'; the current invention can also be used for a device to be informed of an imminent drop of power supply as a 'normal' condition to prepare an entry in a standby state or a powered off state, that is entered upon pressing of a 'power off' button for powering off the device or for putting it into a standby state, and therefore the term 'absence' of supply of mains power can be used as an alternative to 'failure'.

The implementation of the invention is not limited to the embodiments shown. The reader will understand that FIGS. 2 and 3 are non-limiting example embodiments of the present invention and can comprise more or less circuits than depicted, such as for example filter circuits that avoid on the transmitter side that the modulation on the one or more power conductor leads of the external power supply enters the regulator circuit of the power supply, which can possibly disturb its correct functioning. Likewise, a filter may be needed on the receiving side, i.e. the device 22, to avoid that the modulation on the one or more power conductor leads of the external power supply disturbs the correct functioning of the hardware elements of the device. The external power supply is depicted as a so-called linear power supply, but the invention is not limited to this kind of type of power supply, and is also suited for a switched mode power supply for example.

Likewise, the reader will understand that the implementation of the method or the invention is not restricted to an implementation as depicted in the FIGS. 4 and 5, and that the steps of the methods can for example be executed in a different order or in parallel, to gain processing time.

The discussed variants can be used apart, or combined between them to provide a particularly advantageous variant embodiment of the invention.

Although some of the described embodiments discuss a use of electronic circuits, some functions that are presented as being implemented by dedicated electronic circuits may instead be implemented in software to reduce production costs of a device implementing the present invention.

Alternatively, the invention is implemented using a mix of hardand software components, where dedicated hardware components provide functions that are alternatively executed in software. According to a particular embodiment, the invention is entirely implemented in hardware, for example as a dedicated component (for example as an ASIC, FPGA or VLSI) (respectively « Application Specific Integrated Circuit», « Field-Programmable Gate Array» and « Very Large Scale Integration») or as distinct electronic components integrated in a device or in a form of a mix of hardware and software.

The invention claimed is:

1. A method of electric power failure detection for transmission to an electronic device wherein said method is implemented by an external power supply, the electronic device being configured to receive Direct Current power from said external power supply, said external power supply comprising an Alternating Current input for connection to a mains electricity network and said external power supply comprising a Direct Current output for connection to said electronic device via Direct Current power conducting leads, the method comprising:

detecting, via a coupling to the Alternating Current input of the external power supply, absence of supply of mains power on said Alternating Current input of said external power supply; and transmitting, to said electronic device, over said Direct Current power conducting leads, information representative of said absence of supply of mains power on said Alternating Current input when said absence of supply of mains power on said Alternating Current input of said external power supply is detected via said coupling to the Alternating Current input of said external power supply, and informing the electronic device of an imminent Direct Current power failure before Direct Current power output from the external power supply starts to drop, said information comprising an estimation, as a function of current consumption of the electronic device, of a duration of a capacity of the external power supply to continue to provide Direct Current power to the electronic device when said absence of supply of mains power on said Alternating Current input of said external power supply is detected.

2. The method according to claim 1, wherein said method further comprises measuring a duration of said absence of supply of mains power on said Alternating Current input of said external power supply when said absence of supply of mains power on said Alternating Current input of said external power supply is detected, said information comprising a result of said measuring.

3. The method according to claim 1, wherein said information is transmitted through modulating a carrier signal on at least one of said Direct Current power conducting leads.

4. The method according to claim 1, wherein said information is transmitted through modulating Direct Current output voltage level on at least one of said Direct Current power conducting leads.

5. The method according to claim 3, wherein said modulating is a function of duration of said absence of supply of mains power on said Alternating Current input.

6. The method according to claim 4, wherein said modulating is a function of duration of said absence of supply of mains power on said Alternating Current input.

7. A method of electric power failure detection for an electronic device, wherein the method is implemented by said electronic device, said electronic device being configured to receive Direct Current power from an external power supply, the external power supply comprising an Alternating Current input for connection to a mains electricity network and the external power supply has a Direct Current output for connection to said electronic device via Direct Current power conducting leads, the method comprising:

receiving, from said external power supply and over said Direct Current power conducting leads, information representative of an absence of supply of mains power on said Alternating Current input of the external power supply, said absence being detected by said external power supply from a coupling to the Alternating Current input of the external power supply; and transmitting said information to a processor comprised in said electronic device so as to inform it of an imminent Direct Current power failure before Direct Current power output from the external power supply starts to drop, said information comprising an estimation, as a function of current consumption of the electronic device, of a duration of a capacity of the external power supply to continue to provide Direct Current power to the electronic device when said absence of supply of mains power on said Alternating Current input of said external power supply is detected.

8. The method according to claim 7, wherein said information further comprises a measurement of a duration of said absence of supply of mains power on said Alternating Current input of said external power supply when said absence of supply of mains power on said Alternating Current input of said external power supply is detected by said external power supply.

9. The method according to claim 7, wherein said information is received through modulation of a carrier signal on at least one of said Direct Current power conducting leads.

10. The method according to claim 7, wherein said information is received through modulation of Direct Current output voltage level on at least one of said Direct Current power conducting leads.

11. The method according to claim 9, wherein said modulation is a function of duration of said absence of supply of mains power on said Alternating Current input.

12. The method according to claim 10, wherein said modulation is a function of duration of said absence of supply of mains power on said Alternating Current input.

13. An external power supply for providing Direct Current power to an electronic device, wherein said external power supply comprises:
   an Alternating Current input for connection to a mains electricity network;
   a Direct Current output for connection to said electronic device via Direct Current power conducting leads;
   a detector for detecting absence of supply of mains power on said Alternating Current input via a coupling to the Alternating Current input; and
   a transmitter for transmitting, to said electronic device, over said Direct Current power conducting leads, information representative of said absence of supply of mains power on said Alternating Current input when said absence of supply of mains power on said Alternating Current input is detected by said detector via said coupling to said Alternating Current input, and for informing the electronic device of an imminent Direct Current power failure before Direct Current power output from the external power supply starts to drop, said transmitter being configured to transmit said information through modulation of a carrier signal on at least one of said Direct Current power conducting leads and to modulate said carrier signal on at least one of said Direct Current power conducting leads as a function of duration of said absence of supply of mains power on said Alternating Current input.

14. The external power supply according to claim 13, wherein said detector is directly coupled to said Alternating Current input.

15. The external power supply according to claim 13, wherein said detector is directly coupled to internal unregulated alternating current output.

16. The external power supply according to claim 13, wherein said detector is directly coupled to internal unregulated Direct Current output.

17. An electronic device for connection to an external power supply wherein the external power supply comprises an Alternating Current input for connection to a mains electricity network, the external power supply comprising a Direct Current output for connection to said electronic device via Direct Current power conducting leads, the electronic device comprising:
   a processor;
   a receiver configured to receive, over said Direct Current power conducting leads, information representative of an absence of supply of mains power on said Alternating Current input of said external power supply, said absence being detected by said external power supply from a coupling to the Alternating Current input of the external power supply; and
   a transmitter configured to transmit said information to said processor so as to inform said electronic device of an imminent Direct Current power failure before Direct Current power output from the external power supply starts to drop, said information comprising an estimation, as a function of current consumption of the electronic device, of a duration of a capacity of the external power supply to continue to provide Direct Current power to the electronic device when said absence of supply of mains power on said Alternating Current input of said external power supply is detected.

18. An external power supply for providing Direct Current power to an electronic device, wherein said external power supply comprises:
   an Alternating Current input for connection to a mains electricity network;
   a Direct Current output for connection to said electronic device via Direct Current power conducting leads;
   a detector for detecting absence of supply of mains power on said Alternating Current input via a coupling to the Alternating Current input; and
   a transmitter for transmitting, to said electronic device, over said Direct Current power conducting leads, information representative of said absence of supply of mains power on said Alternating Current input when said absence of supply of mains power on said Alternating Current input is detected by said detector via said coupling to said Alternating Current input, and for informing the electronic device of an imminent Direct Current power failure before Direct Current power output from the external power supply starts to drop, said transmitter being configured to transmit said information through modulating Direct Current output voltage level on at least one of said Direct Current power conducting leads and to modulate said Direct Current output voltage level on at least one of said Direct Current power conducting leads as a function of duration of said absence of supply of mains power on said Alternating Current input.

19. The external power supply according to claim 18, wherein said detector is directly coupled to said Alternating Current input.

20. The external power supply according to claim 18, wherein said detector is directly coupled to internal unregulated alternating current output.

21. The external power supply according to claim 18, wherein said detector is directly coupled to internal unregulated Direct Current output.

* * * * *